(12) United States Patent
Beekman et al.

(10) Patent No.: US 6,544,858 B1
(45) Date of Patent: Apr. 8, 2003

(54) METHOD FOR TREATING SILICON-CONTAINING POLYMER LAYERS WITH PLASMA OR ELECTROMAGNETIC RADIATION

(75) Inventors: Knut Beekman, N. Somerset (GB); Jashu Patel, N. Somerset (GB)

(73) Assignee: Trikon Equipments Limited, Newport (GB)

(*) Notice: Subject to any disclaimer, the term of this patent is extended or adjusted under 35 U.S.C. 154(b) by 0 days.

(21) Appl. No.: 09/601,086

(22) PCT Filed: Jan. 27, 1999

(86) PCT No.: PCT/GB99/00283

§ 371 (c)(1),
(2), (4) Date: Aug. 18, 2000

(87) PCT Pub. No.: WO99/39383

PCT Pub. Date: Aug. 5, 1999

(30) Foreign Application Priority Data

Jan. 28, 1998 (GB) .............................................. 9801655

(51) Int. Cl.⁷ .............................................. H01L 21/76
(52) U.S. Cl. ....................... 438/400; 438/437; 438/421; 438/439
(58) Field of Search ................... 438/400, 437, 438/421–425, 439, 713

(56) References Cited

U.S. PATENT DOCUMENTS

| 4,376,672 A | * 3/1983 | Wang et al. ................ 438/713 |
| 5,314,724 A | 5/1994 | Tsukune et al. |
| 5,447,884 A | 9/1995 | Fahey et al. |
| 5,456,952 A | * 10/1995 | Garza ........................ 427/489 |

FOREIGN PATENT DOCUMENTS

| DE | 4013449 A1 | 5/1989 |
| EP | 0 572 704 A1 | 12/1993 |
| GB | 2 235 444 A | 3/1991 |
| WO | WO 94/01885 | 1/1994 |
| WO | WO 99/39383 | 8/1999 |

OTHER PUBLICATIONS

"Isolation Trench Filling," IBM Technical Disclosure Bulletin, Apr. 1985, US, vol. 27, Nr. 11, p. 6524.

Sagawa Seiji, "Manufacture of Semiconductor Device," Patent Abstracts of Japan, Publication No. 60046036, Mar. 12, 1985.

* cited by examiner

Primary Examiner—Carl Whitehead, Jr.
Assistant Examiner—Yennhu B. Huynh
(74) Attorney, Agent, or Firm—Volentine Francos, PLLC

(57) ABSTRACT

A silicon-containing polymer is deposited in a recess on the surface of the substrate. The substrate is then heated to a given temperature. The surface of the substrate, heated to the given temperature and having the silicon-containing polymer deposited thereon, is subjected to gas or vapor activated by a plasma or other electromagnetic radiation which is distinct from a source of heat used to heat the substrate to the given temperature.

37 Claims, 4 Drawing Sheets a)

b)

c)

METHOD FOR TREATING SILICON-CONTAINING POLYMER LAYERS WITH PLASMA OR ELECTROMAGNETIC RADIATION

BACKGROUND OF THE INVENTION

This invention relates to a method of treating a substrate, in particular, although not exclusively, to shallow trench isolation (STI) of semiconductor devices on a substrate, and also to intermetal dielectrics (IMD).

According to WO 94/01885, it is known to achieve planarisation of a depositing layer by depositing a liquid short-chain polymer formed from a silicon containing gas or vapour on a semiconductor wafer.

In a shallow trench isolation (STI) process, semiconductor devices on a wafer are packed tightly together by means of trenches filled with insulating material. In such cases, trench widths tend to vary between 0.13 to 0.35 microns, and trench depths are typically between 0.3 and 0.5 microns. If the depositing material of WO 94/01885 is used in the shallow trench isolation process, the integrity of the dielectric can be tested by cleaving a sample perpendicularly through a trench, dipping the cleaved edge in a silicon dioxide etchant such as 10:1 buffered hydrofluoric acid (BHF) and analysing the cleaved edge in a scanning electron microscope (SEM). However, it has been found that a problem occurs within the trench after de-lineation (etching). In this respect, it has been found that the material filling the narrow gaps may completely etch away from the walls of the trench and material filling wider gaps even shows severe etching from the bottom corners of the trench. Thus, such a shallow trench isolation process has been found to be unsatisfactory. It has been found that the material, when deposited in an STI process, tends to have an inconveniently fast wet etch rate at the top of and/or within the trench. This means that the trench plug does not stand proud of the trench upper surface, as required for effective shallow trench isolation.

In IMD layers there is a requirement to sometimes fill narrow gaps between metal lines as a result of very small pitch/close spacing.

There is therefore a need to provide an improved process.

SUMMARY OF THE INVENTION

According to a first aspect of the present invention, there is provided a method of treating a substrate having a silicon-containing polymer deposited in a recess on its surface, which method comprises the steps of:
(a) heating the substrate; and
(b) subjecting the surface of the heated substrate to gas or vapour activated by a plasma or other electromagnetic radiation other than heat alone.

The silicon-containing polymer layer may be deposited in any manner known in the art. Thus, the method is applicable not only to a method of depositing a layer as described in WO 94/01885, but is also applicable to spin coating processes, eg. "spin on glasses" (SOG). With SOG and other liquid precursor methodologies for depositing doped and undoped silicon oxide materials, wet chemicals are deposited on to a spinning wafer which is then further processed by including the heat treatment to form a stable polymeric oxide. However, in a preferred embodiment, the silicon-containing polymer is deposited on the surface of the substrate by positioning the substrate in a chamber, introducing into the chamber a silicon-containing gas or vapour and a compound, containing peroxide bonding, in vapour form, and reacting the silicon-containing gas or vapour with the compound to form the polymer. In such a case, the silicon-containing gas may be inorganic or organic, and is preferably a silane (for example silane itself) or a higher silane. The compound containing peroxide bonding is preferably hydrogen peroxide.

It has been found that preferred results are obtained when the gas or vapour activation is in the form of a plasma. The plasma treatment is more effective after a period of heat treatment and, without restricting the applicant hereby, it may possibly be due to water present in an unheated layer absorbing or interfering with some radiation characteristic of the plasma. Whilst it has been found that an oxygen plasma may produce some improvement, a $CF_4$ plasma is particularly preferred.

The heating of the substrate, which takes place before subjecting the substrate to the activated gas or vapour, may be provided by any suitable means, but in a preferred embodiment is provided by placing the substrate on a heated platen. The preferred temperature for the heating step is 300° C. to 500° C. In a particularly advantageous embodiment, the substrate is positioned on a platen which is connected to an RF power source. This is in contrast to systems in which the RF source is connected to a "shower head" through which reactants are passed into the chamber and the platen is earthed or electrically floating, or where the plasma is remote from the substrate. In a preferred embodiment of the present invention, the RF power source is a low frequency source and is preferably less than 1 MHz. The low frequency tends to create higher peak-to-peak voltages and a qualitatively different subatomic bombardment than for the same power when applied at a higher frequency (typically 13.56 MHz). As mentioned above, it has been observed that the process is more effective if the substrate is on the RF driven electrode, and therefore subject to a greater level of subatomic bombardment, particularly of ions, than if it were on a floating or grounded electrode.

It is generally the case that the higher the temperature and the higher the peak-to-peak voltages achieved on the substrate, the more effective the treatment becomes.

However, this is not to say that a process where a gas or vapour is ionised by a plasma remote from the substrate or an electrodeless plasma, eg. inductively coupled, or a plasma where the substrate is on a grounded or floating electrode will not be effective.

The method may further comprise the step of depositing or forming a capping layer on the surface of the deposited layer. This capping layer, if used, is deposited after subjecting the substrate to the activated gas or vapour and, in a preferred embodiment, may be formed of $SiO_2$.

In addition, the method may further comprise heating the polymer layer after capping, for example in a furnace.

The substrate has one or more recesses (or trenches) in its surface which are filled with the silicon containing polymer. The treatment described preferably densifies the polymer in the recess. Preferably, an underlayer of thermal oxide, for example silicon dioxide, is provided on the substrate under the deposited polymer. In addition, a mask, for example formed of silicon nitride, can be formed on the thermal oxide layer. The densification may provide a reduction in the wet etch rate of the polymer to one more similar to the thermal oxide underlayer. This provides improvement in the processing of shallow trench isolation of active zones, eg. gates, in the semiconductor device.

Whilst the applicant is not to be restricted hereby, the densification process is believed to be at least partially chemical or radiative in nature because it has been found that argon has no effect, oxygen has some and $CF_4$ has a strong effect. Thus, the physical characteristics of the polymer layer appeared to be modified.

The method is particularly applicable to shallow trench isolation (STI) processes. Thus, preferably the recess width is between 0.13 and 0.35 microns and the recess depth is between 0.3 and 0.5 microns. Preferably, the silicon containing polymer extends from the recess above the upper surface of a semiconductor wafer. This is because, in the STI process, for separation of active silicon or the like in a wafer to be as complete as possible the isolation needs to extend above the surface of the active areas.

The method may also be usefully applied to intermetal dielectric (IMD) layers, in particular where the intermetal gaps are between 0.13 and 0.35 microns.

It is preferable to carry out the treatment with activated gas or vapour of the wafer in a separate chamber from the step of depositing the polymer. It has been found that, in a preferred embodiment, the treatment with activated gas or vapour can be carried out in the same chamber as the previous heat treatment.

In a preferred embodiment, the wafer is heated for 60 seconds at a platen temperature of 350° C. The pressure in the chamber is preferably about 250 mTorr and the flow rate of the $CF_4$, is about 200 SCCM (0.33 Pam$^3$/S). In this preferred embodiment, a 380 kHz power source applies about 500 Watts to the platen, when used, for about 60 seconds. In general, temperature and pressure and power ranges may be limited by the preferable integration of this treatment into a process chamber already provided for the capping of the polymer.

Typical ranges might be:

| | |
|---|---|
| platen temperature | 300–500° C. |
| gas or vapour pressure | 5 mTorr to 500 mTorr |
| power | up to 1 kW |

The gas flow will depend on the pumping speed of the process chamber. It will be appreciated by those skilled in the art that a purpose-built chamber for this process may advantageously apply higher temperatures (for example up to 1200° C.) and higher powers.

Thus, in accordance with a second aspect of the present invention, there is provided a method of isolating active zones in a semiconductor layer on a substrate having a layer of thermal oxide on its surface, comprising depositing a silicon-containing polymer in one or more recesses separating the active zones, heating the substrate, and subjecting the silicon-containing polymer to a gas or vapour activated by a plasma or other electromagnetic radiation other than heat alone such that the wet etch rate of the silicon-containing polymer is reduced to be similar to that of the thermal oxide.

This shallow trench isolation process may have the appropriate preferred features as mentioned above. For example, the method has been found to be particularly advantageous when the width of the one or more recesses is between 0.13 and 0.35 microns and the depth is between 0.3 and 0.5 microns. In a subsequent treatment step, the thermal oxide layer is preferably etched, for example using buffered hydrofluoric acid (BHF). The "similar" wet etch rate referred to above is sufficiently similar such that the silicon containing polymer is capable of standing above the level of the surface of the substrate after the etching. Typically, the activated gas or vapour treatment reduces the wet etch rate of the silicon containing polymer, from 2 to 2.5 times faster than the etch rate of the silicon dioxide, to 1.2 times faster.

In accordance with a third aspect of the present invention, there is provided an apparatus for carrying out the methods referred to above.

Thus the apparatus may comprise means for heating the substrate and means for subjecting the heated substrate to gas or vapour activated by a plasma or other electromagnetic radiation other than heat alone.

The apparatus may comprise a chamber having a platen for supporting the substrate, and means for introducing into the chamber a silicon-containing gas or vapour and a compound containing peroxide bonding.

Although the invention has been defined above it is to be understood that it includes any inventive combination of the features set out above or in the following description.

BRIEF DESCRIPTION OF THE DRAWINGS

The invention may be performed in various ways and a specific embodiment will now be described, by way of example, with reference to the following drawings, in which.

DETAILED DESCRIPTION OF THE PREFERRED EMBODIMENTS

Figure 1:
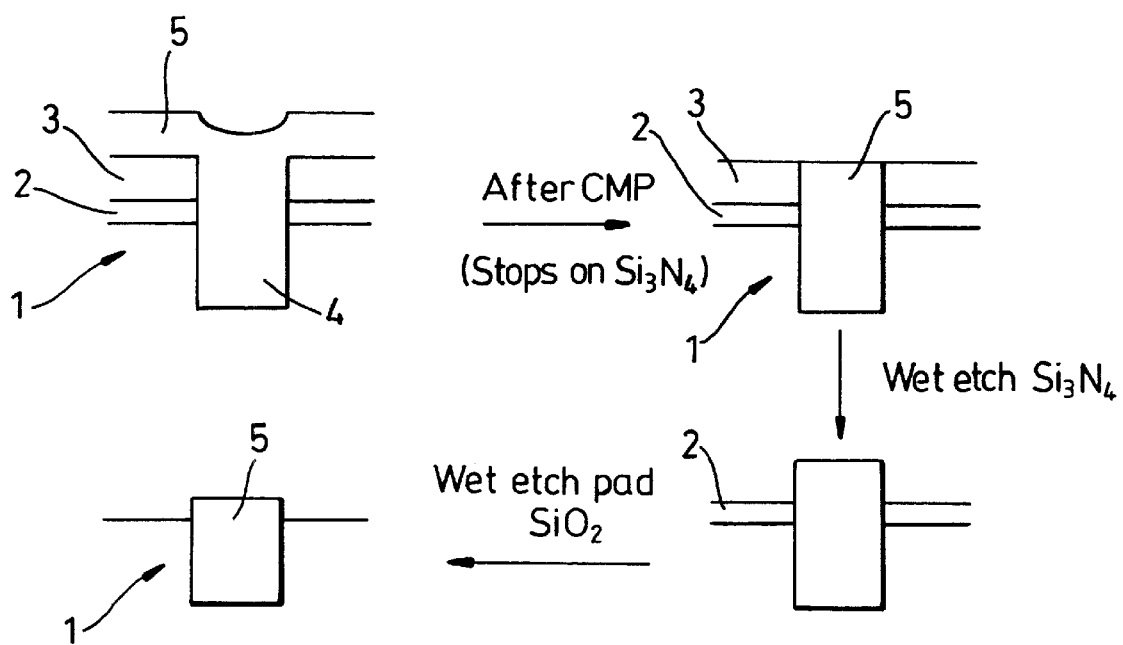
FIG. 1 is a schematic view of part of an STI sequence.

FIG. 1 shows part of a shallow trench isolation (STI) sequence. There is shown a silicon semiconductor wafer 1 having a thermal silicon oxide pad layer 2 on its surface and, on top of the layer 2, a mask layer 3 formed of silicon nitride. There is formed in the wafer 1 a recess 4. In the example illustrated, a silicon containing polymer (Flowfill— Registered Trade Mark) 5 is deposited on the wafer and fills the recess 4. Subsequently, chemical mechanical polishing (CMP) is carried out to remove the deposited polymeric oxide layer from the silicon nitride mask 3.

The silicon nitride mask is then wet etched with the use of, for example, phosphoric acid. The subsequent step is then to wet etch the silicon dioxide pad layer 2 in buffered hydrofluoric acid (BHF).

In order for effective trench isolation, in wet etching the silicon dioxide layer 2, in BHF, it is required that the upper surface of the polymeric substance 5 stands proud of the silicon wafer as shown. However, before the present invention it has been found that the top is etched away too fast and this desired result may not then be achieved.

The integrity of the polymer material 5 can be tested by cleaving a sample perpendicularly through recess 4, dipping the cleaved edge in a silicon dioxide etchant such as 10:1 BHF and analysing the cleaved edge in a scanning electron microscope. The etching procedure is often referred to as de-lineation, decorating or staining. No voiding or unusual etching behaviour of the gap fill material is desirable.

Figure 2:
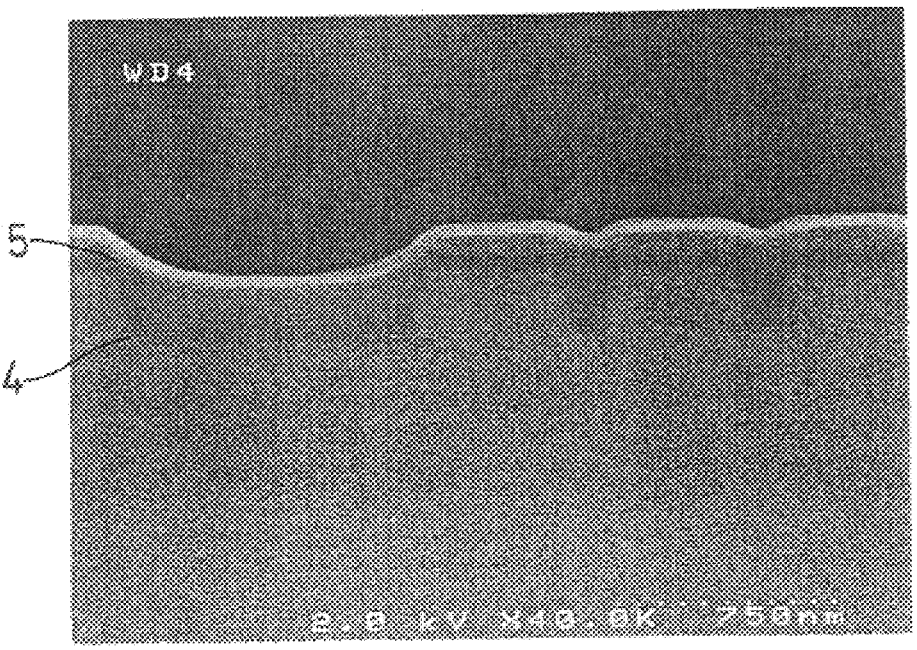
FIG. 2 shows a micrograph of a gap-filled wafer.
Figure 3:
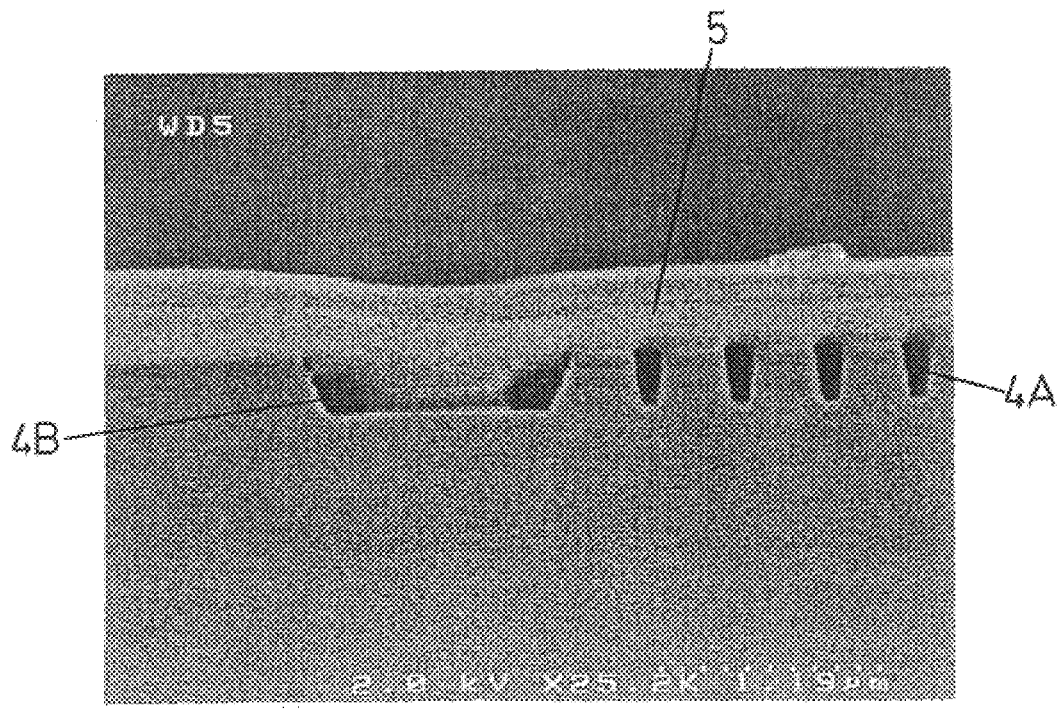
FIG. 3 shows a micrograph similar to that in FIG. 1 after de-lineation.
Figure 4:
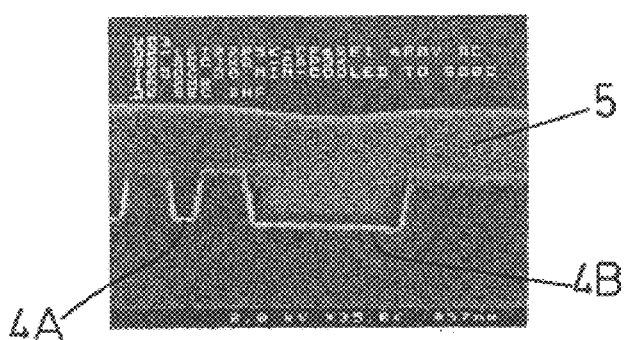
FIGS. 4a–c show various micrographs in which the STI sequence has been modified in accordance with the present invention.
Figure 4:
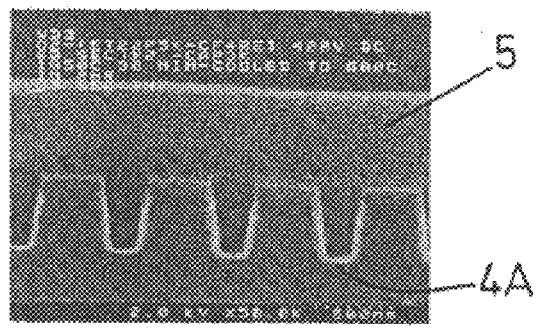
Figure 4:
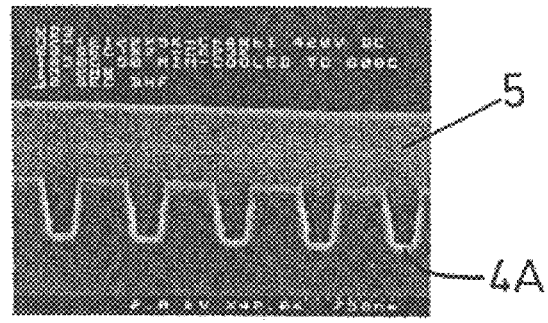

If the polymeric substance 5 is used for the gap fill, in conventional techniques a further problem occurs within the recess 4 after the above-mentioned de-lineation. This can be seen in FIGS. 2 to 4. FIG. 2 shows a typical as deposited polymer layer 5 with good filling of the recess 4 and no voiding prior to de-lineation. FIG. 3 shows a similar film after de-lineation. The polymer 5 filling the narrow recesses 4A has completely etched away while the material filling the wider recess 4B shows severe etching from the bottom corners of the recess 4B. It can be concluded that the material 5 filling the recess 4 is a different consistency or density compared to that at the surface. If the STI process is modified to include a treatment step after deposition of the polymer 5, the improved results shown in FIG. 4 are achieved. This treatment step involves placing the wafer deposited with the layer 5 on to a heated platen at 350 to 400° C. and subjecting it to a $CF_4$ plasma. This is accomplished by applying a low frequency RF power source to a platen supporting the wafer through which the reactants pass to the chamber. The preferred conditions are:

| | |
|---|---|
| preheat, wafer warm up | 60 seconds |
| wafer platen temperature | 350 deg. C. |
| pressure | 250 millitorr |
| gas flow of $CF_4$ | 200 sccm (0.33 $Pam^3/S$) |
| 380 kHz power | 500 watts applied to wafer platen |
| time | 60 seconds |

This may then be followed by deposition of a capping layer in a manner known in the art.

As can be seen from FIGS. 4a, 4b, and 4c, following this treatment the polymer layer 5 shows excellent filling of both the narrow recesses 4A and the wider recesses 4B.

It has been found that, without the plasma treatment, the deposited material 5 for STI tends to have an inconveniently fast wet etch rate at the top of and/or within the trench. Whilst the applicant is not to be bound hereby, it is believed that this is because these trenches are so narrow the polymer material 5 bonds tightly to the side walls. In a narrow trench this surface bonding effect will essentially account for all the material in the trench. Thus, during the subsequent steps, the material 5 in the trench may become more porous than in wider gaps where there is a volume within the trench for restructuring and densification of the film to take place away from the tightly bonded sidewalls.

Figure 5:
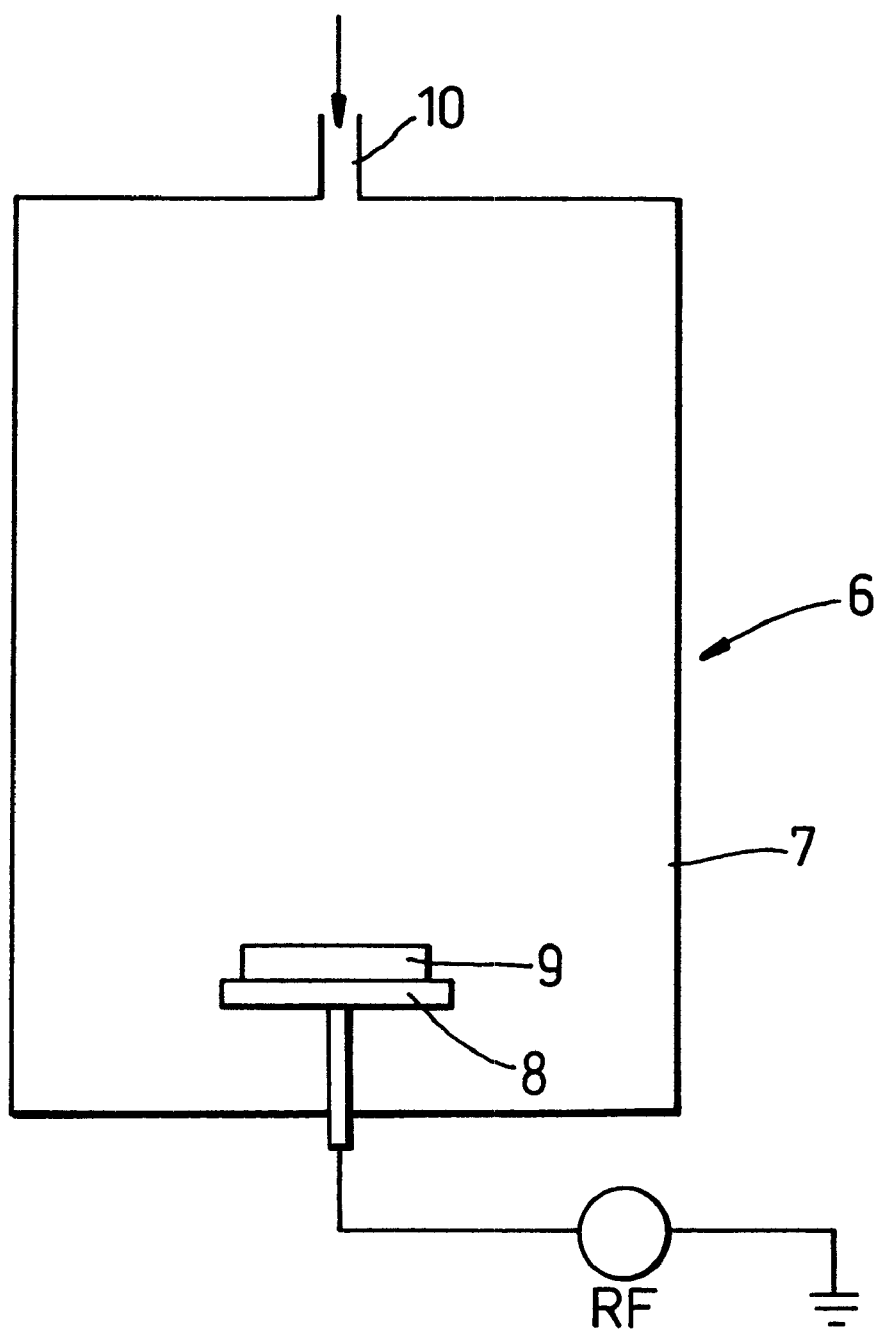
FIG. 5 is a schematic view of an apparatus for carrying out the method of the invention.

FIG. 5 shows an apparatus generally at 6 for carrying out the method of the invention. The apparatus 1 comprises a chamber 7 having a platen 8 connected to an RF source and which may be heated. The platen 8 supports substrate 9. A gas or vapour may be passed into chamber 7 through inlet 10 and is activated by a plasma or other electromagnetic radiation.

What is claimed is:

1. A method of treating a surface of a substrate, which method comprises:
    depositing a silicon-containing polymer in a recess on the surface of the substrate;
    heating the substrate, having the silicon-containing polymer deposited thereon, to a given temperature by exposing the substrate to a heat source; and
    subjecting the surface of the substrate, heated to the given temperature and having the silicon-containing polymer deposited thereon, to gas or vapour activated by a plasma or other electromagnetic radiation which is distinct from the heat source,
    wherein the silicon-containing polymer is deposited on the surface of the substrate by positioning the substrate in a chamber, introducing into the chamber a silicon-containing gas or vapour and a compound containing peroxide bonding, in vapour form, and reacting the silicon-containing gas or vapour with the compound to form the polymer.

2. A method according to claim 1, wherein the silicon-containing gas is a silane or higher silane.

3. A method according to claim 1, wherein the compound containing peroxide bonding is hydrogen peroxide.

4. A method according to claim 1, wherein the surface of the substrate is subjected to the activated gas or vapour after a period of the heating of the substrate.

5. A method according to claim 1, wherein the activated gas or vapour is an oxygen plasma.

6. A method according to claim 1, wherein the activated gas or vapour is a $CF_4$ plasma.

7. A method according to claim 1, wherein the heat source is a heated platen which supports the substrate.

8. A method according to claim 1, wherein the given temperature is in a range of 300° C. to 500° C.

9. A method according to claim 1, wherein the substrate is positioned on a platen connected to an RF power source.

10. A method according to claim 9, wherein the RF power is less than 1 MHz.

11. A method according to claim 1, further comprising depositing or forming a capping layer on the substrate of the deposited polymer.

12. A method according to claim 11, wherein the capping layer is deposited after subjecting the substrate to the activated gas or vapour.

13. A method according to claim 11, wherein the capping layer is formed of $SiO_2$.

14. A method according to any one of claims 11, further comprising heating the polymer after capping.

15. A method according to claim 1, wherein the polymer is densified.

16. A method according to claim 1, wherein an underlayer of thermal oxide is provided on the substrate under the deposited polymer.

17. A method according to claim 16, wherein a mask is formed on the thermal oxide layer.

18. A method according to claim 1 in a shallow trench isolation process, wherein the recess width is between 0.13 and 0.35 microns.

19. A method according to claim 1 in a shallow trench isolation process, wherein the recess depth is between 0.3 and 0.5 microns.

20. A method according to claim 1, wherein the silicon-containing polymer extends from the recess above the surface of the substrate, and wherein the substrate is a semiconductor wafer.

21. A method according to claim 1, wherein the polymer is an intermetal dielectric.

22. A method according to claim 21, wherein the recess is formed of an intermetal gap of between 0.13 and 0.35 microns.

23. A method according to claim 1, wherein the gas or vapour pressure is between 5 mTorr and 500 mTorr.

24. A method of isolating active zones in a semiconductor layer on a substrate having a layer of thermal oxide on its surface, comprising:
    depositing a silicon-containing polymer in one or more recesses separating the active zones;
    heating the substrate, having the silicon-containing polymer deposited thereon, to a given temperature by transferring heat to the substrate to a heat source; and
    subjecting the surface of the substrate, heated to the given temperature and having the silicon-containing polymer deposited thereon, to a gas or vapour activated by a plasma or other electro-magnetic radiation which is distinct from the heat source such that a wet etch rate of the silicon-containing polymer is reduced to be similar to that of the thermal oxide.

25. A method according to claim 24, wherein the thermal oxide layer is etched.

26. A method according to claim 25, wherein the thermal oxide layer is etched using buffered hydrofluoric acid.

27. A method according to claim 24, wherein the wet etch rate of the silicon-containing polymer is reduced to 1.2 times faster than that of the thermal oxide.

28. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein the activated gas or vapour is a $CF_4$ plasma.

29. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein the substrate is positioned on a platen connected to an RF power source.

30. A method according to claim 29, wherein the RF power is less than 1 MHz.

31. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein the polymer is densified.

32. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein an underlayer of thermal oxide is provided on the substrate under the deposited polymer.

33. A method according to claim 32, wherein a mask is formed on the thermal oxide layer.

34. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein the method is carried out in a shallow trench isolation process, and wherein the recess width is between 0.13 and 0.35 microns.

35. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein the method is carried out in a shallow trench isolation process, and wherein the recess depth is between 0.3 and 0.5 microns.

36. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein the method is carried out in an intermetal dielectric process, and wherein the recess is formed of an intermetal gap of between 0.13 and 0.35 microns.

37. A method of treating a surface of a substrate, which method comprises:

depositing a silicon-containing polymer in a recess on the surface of the substrate;

heating the substrate, having the silicon-containing polymer deposited thereon, to a given temperature by exposing the substrate to a heat source; and subjecting the surface of the substrate, heated to the given temperature and having the silicon-containing polymer deposited thereon, to gas or vapour activated by a plasma or other electromagnetic radiation which is distinct from the heat source, wherein the gas or vapour pressure is between 5 mTorr and 500 mTorr.

* * * * *

UNITED STATES PATENT AND TRADEMARK OFFICE
CERTIFICATE OF CORRECTION

PATENT NO. : 6,544,858 B1
DATED : April 8, 2003
INVENTOR(S) : Knut Beekman et al.

It is certified that error appears in the above-identified patent and that said Letters Patent is hereby corrected as shown below:

Column 6,
Line 60, change "to a heat source" to -- from a heat source --.

Signed and Sealed this

Twenty-first Day of June, 2005

JON W. DUDAS
*Director of the United States Patent and Trademark Office*